United States Patent
Khurana et al.

(10) Patent No.: US 10,972,092 B2
(45) Date of Patent: Apr. 6, 2021

(54) POWER-ON RESET CIRCUIT

(71) Applicant: TEXAS INSTRUMENTS INCORPORATED, Dallas, TX (US)

(72) Inventors: Rishubh Khurana, New Delhi (IN); Tanmay Neema, Bengaluru (IN); Kanak Chandra Das, Gayeshpur (IN); Atul Kumar Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/880,541

(22) Filed: May 21, 2020

(65) Prior Publication Data
US 2021/0036701 A1    Feb. 4, 2021

(30) Foreign Application Priority Data
Jul. 30, 2019 (IN) .............................. 201941030672

(51) Int. Cl.
*G06F 1/24* (2006.01)
*H03K 17/22* (2006.01)
*H03K 17/30* (2006.01)

(52) U.S. Cl.
CPC ............... *H03K 17/22* (2013.01); *G06F 1/24* (2013.01); *H03K 17/30* (2013.01)

(58) Field of Classification Search
CPC ........... G06F 1/24; H03K 17/22; H03K 17/30
USPC .................................................. 327/142, 143
See application file for complete search history.

(56) References Cited

U.S. PATENT DOCUMENTS

| | | | | |
|---|---|---|---|---|
| 5,952,800 A * | 9/1999 | Shibata | ................. | G11B 19/047 318/453 |
| 7,391,665 B1 * | 6/2008 | Maung | .................... | G11C 5/147 365/226 |
| 8,823,418 B2 * | 9/2014 | Chang | ................. | G01R 19/0084 327/77 |

* cited by examiner

*Primary Examiner* — William Hernandez
(74) *Attorney, Agent, or Firm* — John R. Pessetto; Charles A. Brill; Frank D. Cimino

(57) ABSTRACT

An integrated circuit includes a power-on reset (POR) circuit and a digital logic circuit. The POR has first and second control outputs. The POR circuit is configured to generate a first control signal on the first control output responsive to a supply voltage on the supply voltage node exceeding a first threshold voltage and is configured to generate a second control signal on the second control output responsive to the supply voltage exceeding a second threshold voltage. The digital logic circuit has a first control input coupled to the first control output of the POR circuit and has a second control input coupled to the second control output of the POR circuit. The digital logic circuit is configured to initiate a first read transaction responsive to assertion of the first control signal and to initiate a second read transaction responsive to assertion of the second control signal.

8 Claims, 7 Drawing Sheets

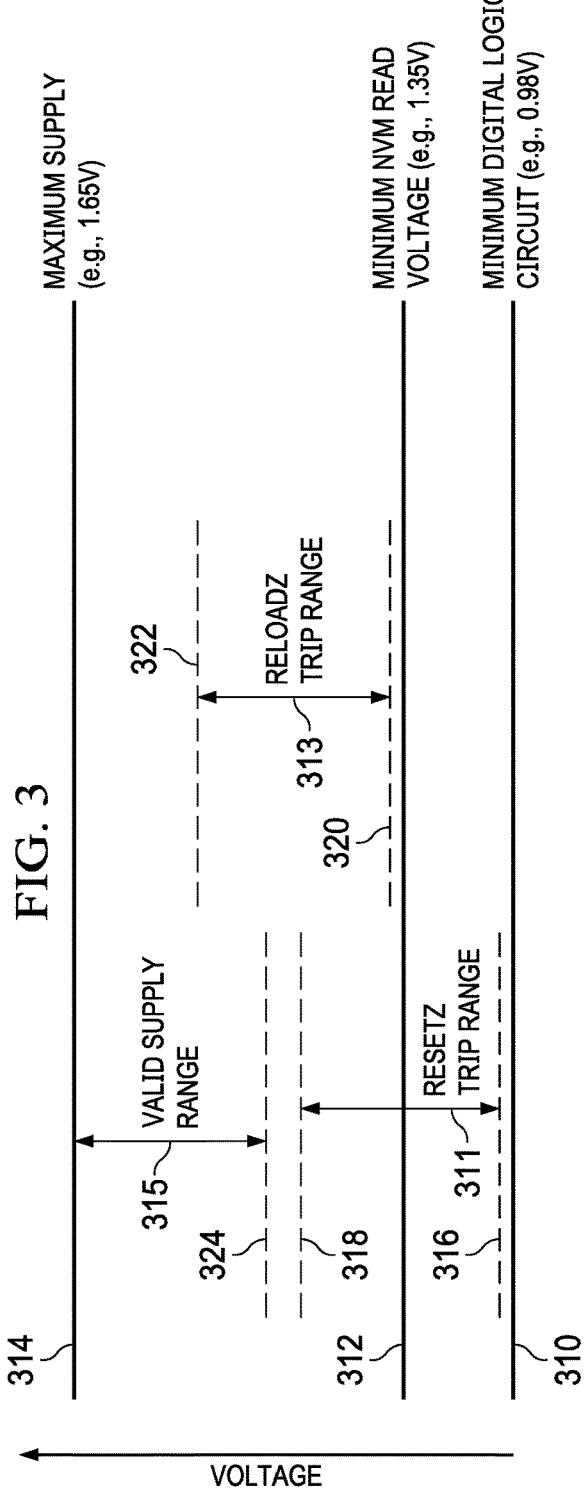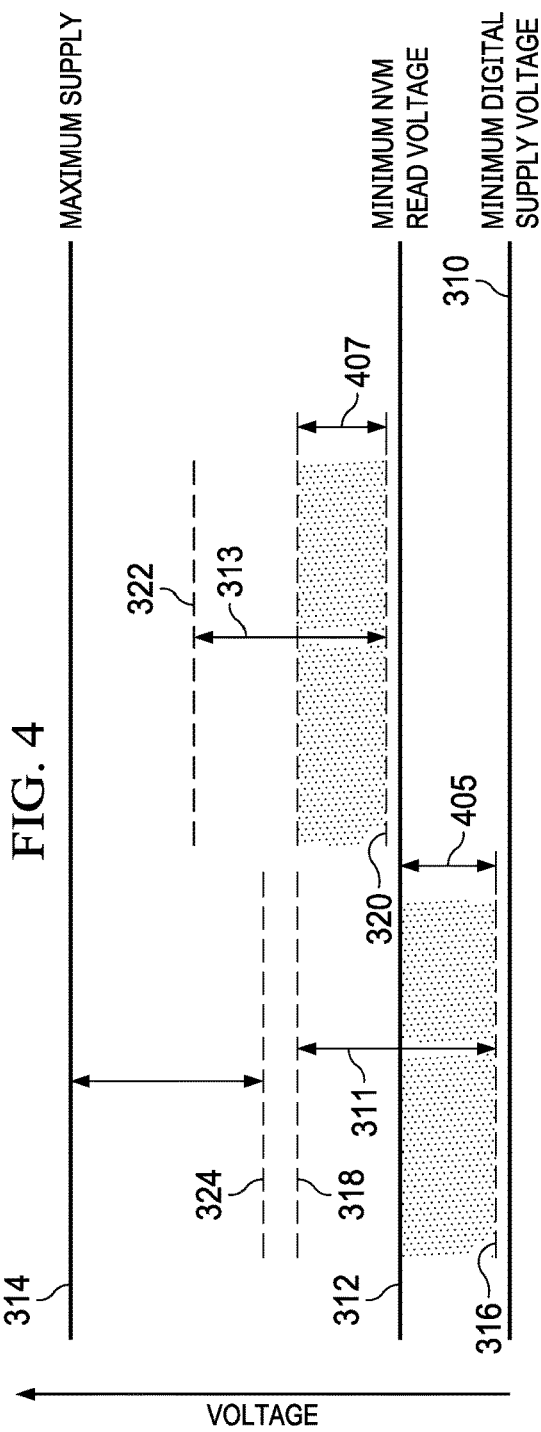

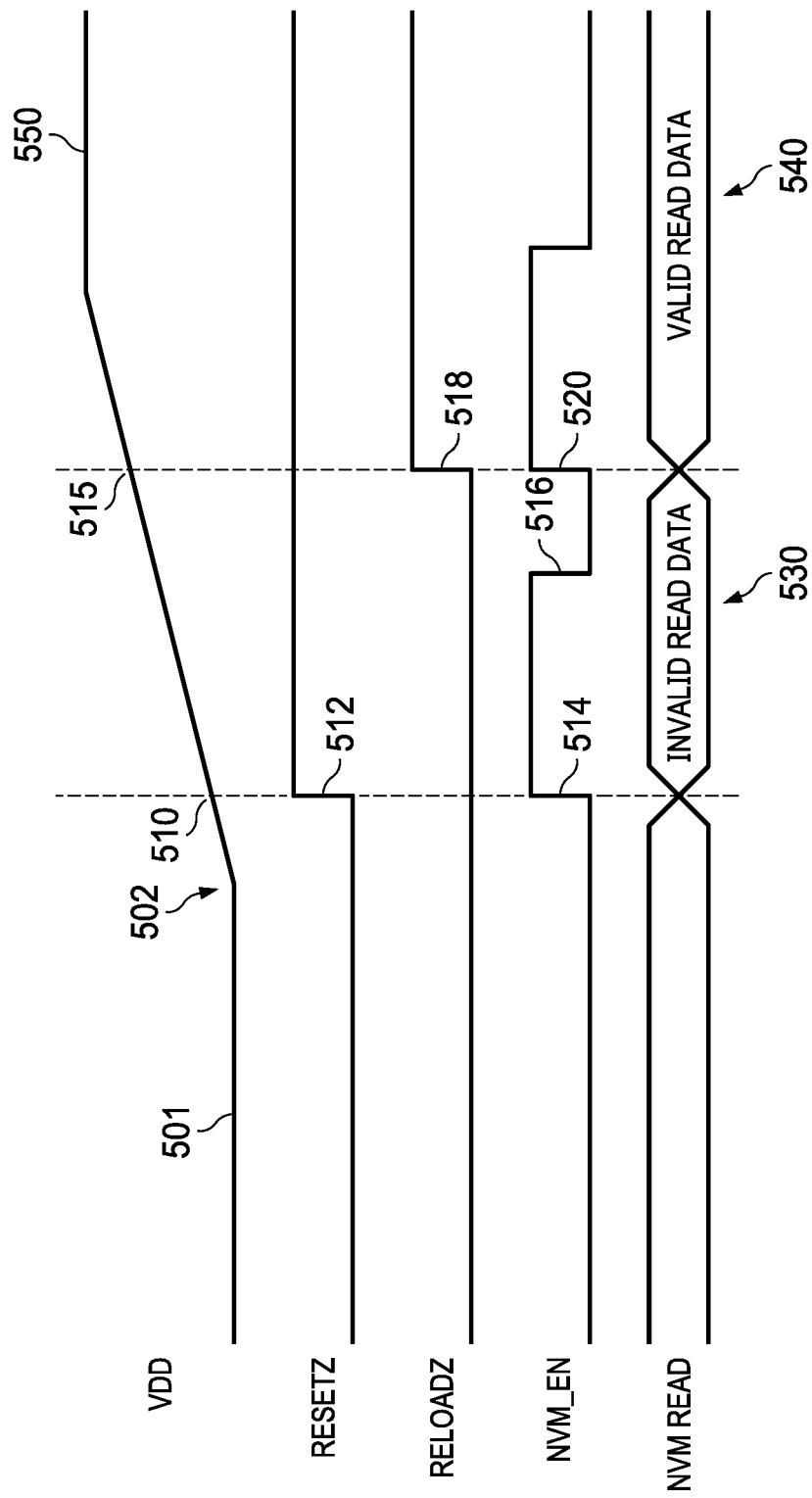

POWER-ON RESET CIRCUIT

CROSS-REFERENCE TO RELATED APPLICATIONS

This application claims priority to U.S. Provisional Application No. 201941030672, filed Jul. 30, 2019, which is hereby incorporated by reference.

BACKGROUND

A power-on reset (POR) circuit causes a logic circuit to remain in a reset state following a power cycle until the power supply voltage has increased to a safe operating voltage. A logic circuit attempting to operate from a supply voltage below its pre-designated safe operating voltage may cause the logic circuit to operate in an unpredictable manner.

SUMMARY

In at least one example, an integrated circuit includes a power-on reset (POR) circuit and a digital logic circuit. The POR has first and second control outputs. The POR circuit is configured to generate a first control signal on the first control output responsive to a supply voltage on the supply voltage terminal exceeding a first threshold voltage and is configured to generate a second control signal on the second control output responsive to the supply voltage exceeding a second threshold voltage. The digital logic circuit has a first control input coupled to the first control output of the POR circuit and has a second control input coupled to the second control output of the POR circuit. The digital logic circuit is configured to initiate a first read transaction responsive to assertion of the first control signal and to initiate a second read transaction responsive to assertion of the second control signal.

BRIEF DESCRIPTION OF THE DRAWINGS

For a detailed description of various examples, reference will now be made to the accompanying drawings in which:

FIG. 3 illustrates various voltages monitored by the POR circuit.

FIG. 4 illustrates the voltages of FIG. 3 for the case in which the POR circuit releases the digital logic circuit from its reset state when VDD is below a minimum supply voltage for the non-volatile memory.

FIG. 5 includes a timing diagram illustrating the operation of the POR circuit and the digital logic circuit for the case depicted in FIG. 4.

DETAILED DESCRIPTION

Figure 1:
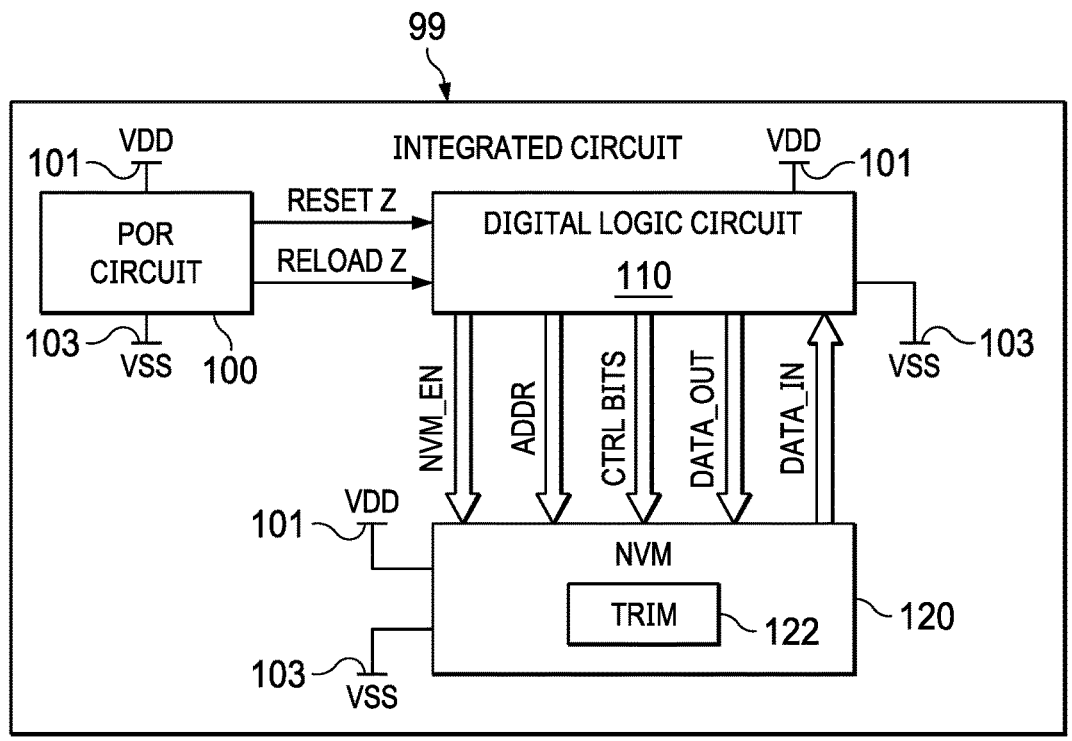
FIG. 1 illustrates an example of at least a portion of an integrated circuit including a power-on reset (POR) circuit coupled to a digital logic circuit with the digital logic circuit coupled to non-volatile memory.

FIG. 1 shows an example of at least a portion of an integrated circuit (IC) 99. In this example, IC 99 includes a power-on reset (POR) circuit 100, a digital logic circuit 110, and a non-volatile memory (NVM) 120. The POR circuit 100, digital logic circuit 110, and NVM 120 are coupled to a supply voltage node (also referred to herein as a "terminal") 101 (VDD) and to a common node 103 (VSS). The POR circuit 100 produces control signals RESETZ and RELOADZ, which are provided as inputs to the digital logic circuit 110. The NVM 120 is coupled to the digital logic circuit 110. In the example IC 99 of FIG. 1, the NVM 120 includes trim storage 122 in which one or more trim values can be stored. The trim values are retrieved by digital logic circuit 110 upon a power-on event and are used to configure the IC 99 (e.g., adjust a value of resistance, a value of capacitance, etc.). The signals between the digital logic circuit 110 and the NVM 120 include an NVM enable signal (NVM_EN), an address bus (ADDR), control bits (CTRL BITS), a data out bus (DATA OUT), and a data in bus (DATA IN). The digital logic circuit 110 can issue a read command (encoded in CTRL BITS) to the NVM 120 to trim data at an address specified by ADDR in order to read, for example, trim data stored in NVM 120. The read data is returned by NVM 120 to the digital logic circuit 110 over DATA IN. The NVM 120 is maintained in a disabled state until NVM_EN is asserted (e.g., high).

During a power-on event, the VDD supply voltage increases from 0 V to its final steady-state level. The digital logic circuit 110 is not guaranteed to operate correctly until VDD reaches a minimum level consistent with operation of the digital logic circuit 110 (referred to herein as the "minimum digital logic circuit voltage"). Similarly, the NVM 120 is not guaranteed to operate correctly until VDD reaches a minimum level consistent with operation of the NVM 120 (referred to herein as the "minimum NVM read voltage"). The minimum NVM read voltage may be different than the minimum digital logic circuit voltage. In the example described below, the minimum NVM read voltage is greater than the minimum digital logic circuit voltage. In one example, the IC 99 is rated to operate from a steady-state supply voltage between 1.55 V and 1.65 V, the minimum digital logic circuit voltage is 0.98 V, and the minimum NVM read voltage is 1.35 V. That is, in this example VDD needs to be at least 0.98 V for the digital logic circuit 110 to operate as intended and at least 1.35 V for the NVM 120 to accurately respond to read commands from the digital logic circuit 110.

During a power-on event, the POR circuit 100 monitors the level of VDD as VDD ramps up from 0 V to its final steady-state level. When VDD exceeds the minimum digital circuit voltage (e.g., 0.98 V in one example), the POR circuit 100 asserts RESETZ, and when VDD exceeds the minimum NVM read voltage, the POR circuit 100 asserts RELOADZ. In one example, RESETZ and RELOADZ are initially logic low (e.g., 0 V) and assertion of those signals means that the signals are asserted to a logic high state. The digital logic circuit 110 is maintained in a reset state (idle) until RESETZ is forced high by the POR circuit 100 at which time digital logic circuit 110 is released from its reset state to begin operation. One of the operations that the digital logic circuit 110 performs is to assert NVM_EN to the NVM 120 to enable operation of the NVM. Thus, NVM_EN is asserted (e.g., high) approximately when RESETZ transitions from low to high. The digital logic circuit 110 then initiates a read transaction to the NVM 120. As described below, the POR circuit 100 controls the assertion (low to high transition) of RELOADZ in a manner to ensure that VDD is above the minimum NVM read voltage for NVM 120.

The example of FIG. 1 pertains to different levels of minimum required supply voltages for the digital logic circuit 110 and NVM 120 in IC 99. However, the principles described herein pertain to power-on reset control of two or more circuits that have different minimum operating voltage ratings. That is, the scope of this disclosure is not limited to specifically NVMs and their use to trim an IC.

There is a general trend towards lower IC power supply voltages, and thus the difference between the minimum supply voltages of different circuits (e.g., digital logic circuit 110 and NVM 120) within an IC, as well as the IC's minimum valid supply voltage, also decreases. These decreases govern the design complexity and area of the POR circuit. One complicating factor is that the characteristics of a circuit vary with process technology. For example, any resistors used in the POR circuit will not have a resistance that is exactly the designed value. A comparator may have an offset. Further, if the POR circuit includes a reference voltage source (e.g., a bandgap voltage source), the reference voltage generated by the reference voltage source may deviate substantially from its designed, nominal value. These factors contribute to some POR circuit, for example, releasing the digital logic circuit from its reset state before VDD has actually reached the minimum digital logic circuit voltage. Similarly, the NVM may be released before its voltage is sufficiently high to ensure proper NVM operation. The POR circuit 100 described herein is a relatively low area, low complexity circuit which is usable for handling small differences between the minimum IC supply voltage and the minimum supply voltage requirement of the various circuits within the IC (e.g., 0.98 V for the digital logic circuit 110 and 1.35 V for the NVM 120).

Figure 2:
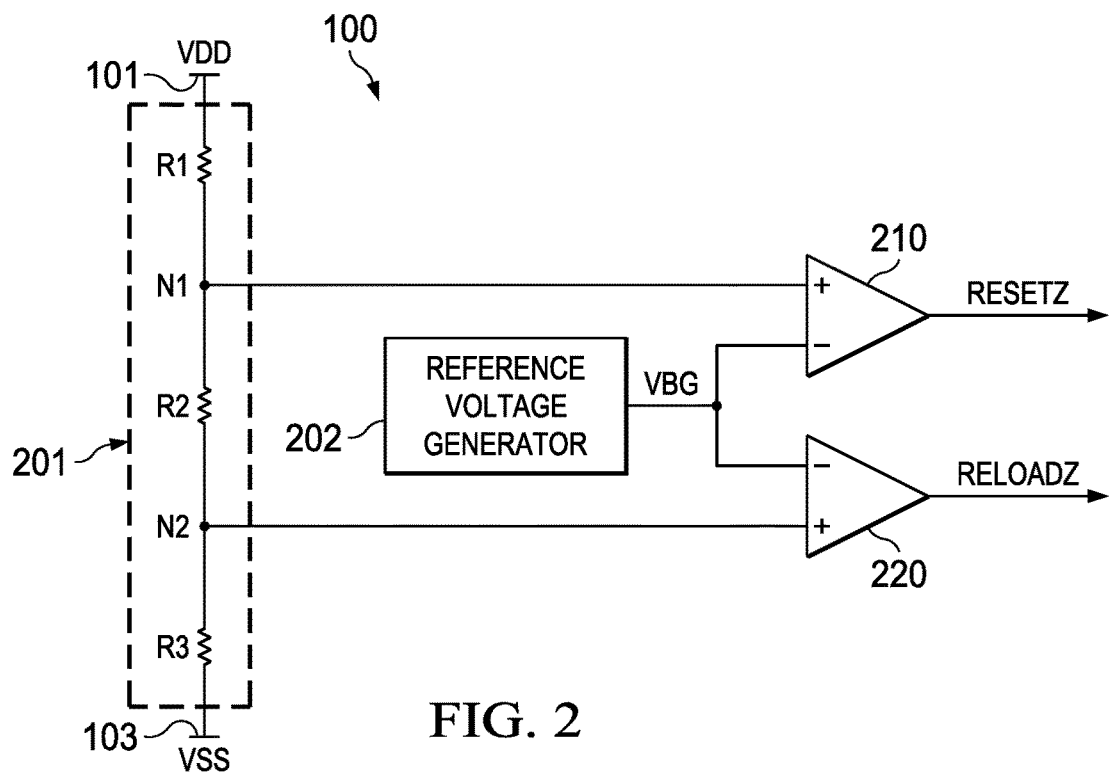
FIG. 2 shows an example implementation of the POR circuit.

FIG. 2 shows an example implementation of POR circuit 100. In this example, POR circuit 100 includes a voltage divider 201, a reference voltage generator 202, and comparators 210 and 220. The voltage divider 201 in this example is a resistor divider comprising resistors R1, R2, and R3. R1-R3 are coupled in series between the supply voltage node 101 and the common node 103. More than three resistors can be coupled in series between nodes 101 and 103 in other implementations. The node between R1 and R2 is labeled N1 and the node between R2 and R3 is labeled N2. The voltage on N1 (VN1) is a fraction of the difference between VDD and VSS, specifically, $$VN1 = \frac{(VDD - VSS)*(R2 + R3)}{R1 + R2 + R3}$$

The voltage on N2 (VN2) also is a fraction of the difference between VDD and VSS, $$VN2 = \frac{(VDD - VSS)*(R3)}{R1 + R2 + R3}$$

From the equations above, it can be seen that VN1 is greater than VN2.

Comparator 210 has a non-inverting (+) input and an inverting input (−). In the example of FIG. 2, N1 is coupled to the non-inverting input of comparator 210. Similarly, comparator 220 has a non-inverting input and an inverting input. N2 is coupled to the non-inverting input of comparator 220.

The reference voltage generator 202 generates a reference voltage labeled VBG. The reference voltage generator 202 may comprise a bandgap voltage generator or any other suitable type of reference voltage generator. As a bandgap voltage generator, reference voltage generator 202 generates the output reference voltage VBG which is a fixed voltage that is generally not influenced by changes in temperature or VDD. VBG is coupled to the inverting inputs of both comparators 210 and 220. The output of comparator 210 generates the control signal RESETZ and the output of comparator 220 generates the control signal RELOADZ.

With VN1 less than VBG, RESETZ will be low. Similarly, with VN2 less than VBG, RELOADZ will also be low. During a power-on event, initially VDD will be low enough that both VN1 and VN2 will be less than VBG and both RESETZ and RELOADZ will be low. As VDD increases, VDD eventually becomes high enough that VN1 exceeds VBG. As a result, the comparator 210 forces RESETZ high. As VDD continues to increase, eventually VN2 also exceeds VBG thereby causing comparator 220 to force RELOADZ high. As such, during a power-on event in which VDD increases from VSS to its final steady-state level, RELOADZ transitions from low to high after RESETZ transitions from low to high.

FIG. 3 illustrates various voltages for the IC 99 of FIG. 1. The minimum digital logic circuit voltage is illustrated at 310. The minimum NVM read voltage is illustrated at 312, and the maximum supply voltage is illustrated at 314. The maximum supply voltage is the maximum power supply voltage rating for the IC 99. The voltage values in parentheses are example voltages and were mentioned above. The example voltage for the minimum digital logic circuit voltage 310 is 0.98 V. The example voltage for the minimum NVM read voltage 312 is 1.35 V. The example voltage for the maximum supply voltage 314 is 1.65 V.

The IC 99 is rated to operate from a supply voltage VDD in the range shown at 315, that is between voltage levels 324 and 314. As noted above, due to variations in the resistances of R1-R3, the offsets within comparators 210 and 220, and the variation of VBG due to manufacturing process variations, the trip point of comparator 210 for RESETZ is within the range illustrated as 311 between a lower level 316 and an upper level 318. That is, the range of trip points for comparator 210 across a large sample of ICs 99 is between voltage levels 316 and 318. Similarly, the trip point of comparator 220 for RELOADZ is within the range illustrated as 313 between a lower level 320 and an upper level 322. That is, the range of trip points for comparator 220 across a large sample of ICs 99 is between voltage levels 320 and 322.

Because comparators 210 and 220 are coupled to the same reference voltage generator 202 and because the comparators 210, 220 are coupled to the same voltage divider 201, the trip-point error in both RESETZ and RELOADZ will be correlated. That is, if RESETZ trips at a lower voltage of VDD, then RELOADZ will also trip at a lower voltage, and vice versa.

The range 311 of VDD for the trip-point of comparator 210 to transition RESETZ from low to high, due to process variations, means that, due to the process variations, some comparators 210 (in some instances of ICs 99) will trip when VDD exceeds a particular voltage that is below the minimum NVM read voltage 312, while comparators 210 for other instances of IC 99 will trip when VDD exceeds a particular voltage that is above the minimum NVM read voltage 312.

FIG. 4 illustrates an example of a trip-point for comparator 210 for a given IC 99 being below the minimum NVM read voltage 312 as illustrated at 405. As explained above, NVM EN is asserted (low to high) by POR circuit 100 approximately when RESETZ is asserted, and thus when VDD is below the minimum NVM read voltage 312. A read of NVM 120 will occur but the return data (e.g., trim values) are not guaranteed to be valid because VDD was too low (i.e., below the minimum NVM read voltage). However, because RESETZ and RELOADZ are generated based on the same reference voltage generator 202, a trip-point for comparator 210 (RESETZ) being in a lower range 405 of range 311 also means that the trip-point for comparator 220 (RELOADZ) will also be in a corresponding lower range 407 of range 313. That the RESETZ's and RELOADZ's trip-points are correlated in this way means that RELOADZ will trip after RESETZ trips and RELOADZ will transition from low to high when VDD is above the minimum NVM read voltage 312 but below the minimum valid IC supply voltage 324. This configuration of RESETZ trip-point range 405 and RELOADZ trip-point range 407 ensures that whenever RESETZ transitions from low to high, RESETZ will be below the minimum NVM read voltage 312 and it will be followed by a RELOADZ low to high transition before the IC supply voltage reaches its stable value. The POR circuit 100 asserting RELOADZ (which will occur when VDD is above the minimum NVM read voltage 312) also causes digital logic circuit 110 to again assert NVM EN to again initiate a read of NVM 120. This time, the read of NVM 120 will occur when VDD is above the minimum NVM read voltage 312 and the return NVM read data will be valid.

FIG. 5 shows a timing diagram illustrating the operation described above. VDD is shown starting at an initial (e.g., 0 V) voltage level at 501. A power-on event begins at 502 at which time VDD begins to increase as shown toward its final steady-state level at 550. At 510, VDD reaches the trip-point for comparator 210 which is above the minimum digital logic circuit voltage (but still below the minimum NVM read voltage) and the POR circuit 100 responds by asserting RESETZ at 512. As shown at 512, RESETZ transitions form low to high. The digital logic circuit 110 also asserts NVM EN at 514. With NVM EN now being high, digital logic circuit 110 performs a read of NVM 120 at 530. However, because VDD is still below the minimum NVM read voltage during read 530, the return data from NVM 120 is considered invalid. NVM EN becomes low again at 516 towards the end of the read transaction. The NVM EN signal is brought back to 0 (NVM disable state) once the NVM operation is completed in order to reduce power consumption by keeping the NVM disabled until such time when an NVM operation is needed.

As VDD continues to increase, VDD eventually reaches the trip-point for comparator 220 at 515 and RELOADZ is forced high as shown at 518. The digital logic circuit 110 responds to assertion of RELOADZ by again forcing NVM EN high (520) and initiating a second read of NVM 120 at 540. During this second read of NVM 120, however, VDD is above the minimum NVM read voltage and the read returns valid data from NVM 120 to the digital logic circuit 110.

Figure 6:
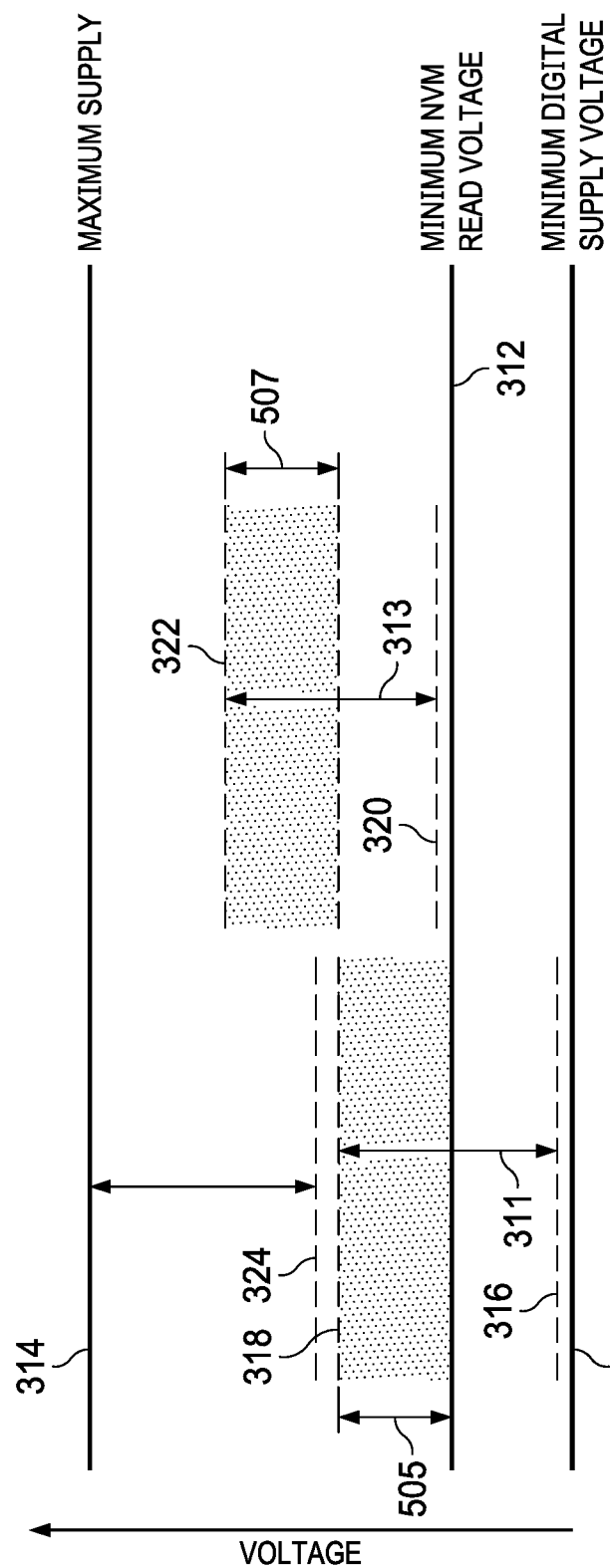
FIG. 6 illustrates the voltages of FIG. 3 for the case in which the POR circuit releases the digital logic circuit from its reset state when VDD is above the minimum supply voltage for the non-volatile memory.

FIG. 6 illustrates an example of a trip-point for comparator 210 for a given IC 99 for VDD being above the minimum NVM read voltage 312 as illustrated at 505, which is the upper portion of range 311. The trip-point for comparator 220 occurs with VDD being in the upper portion 507 of range 313 due to the trip-points for comparators 210 and 220 being correlated as described above. This would mean that RELOADZ transitioning from low to high may or may not happen because a portion of RELOADZ trip-point range 507 is above the minimum valid IC supply voltage (324). However, not having a RELOADZ low to high transition should not be a concern as the RESETZ trip-point is above the minimum NVM read voltage 312 in which case the NVM read operation triggered by a low to high transition of RESETZ itself would result in a valid return of read data from NVM 120.

Figure 7:
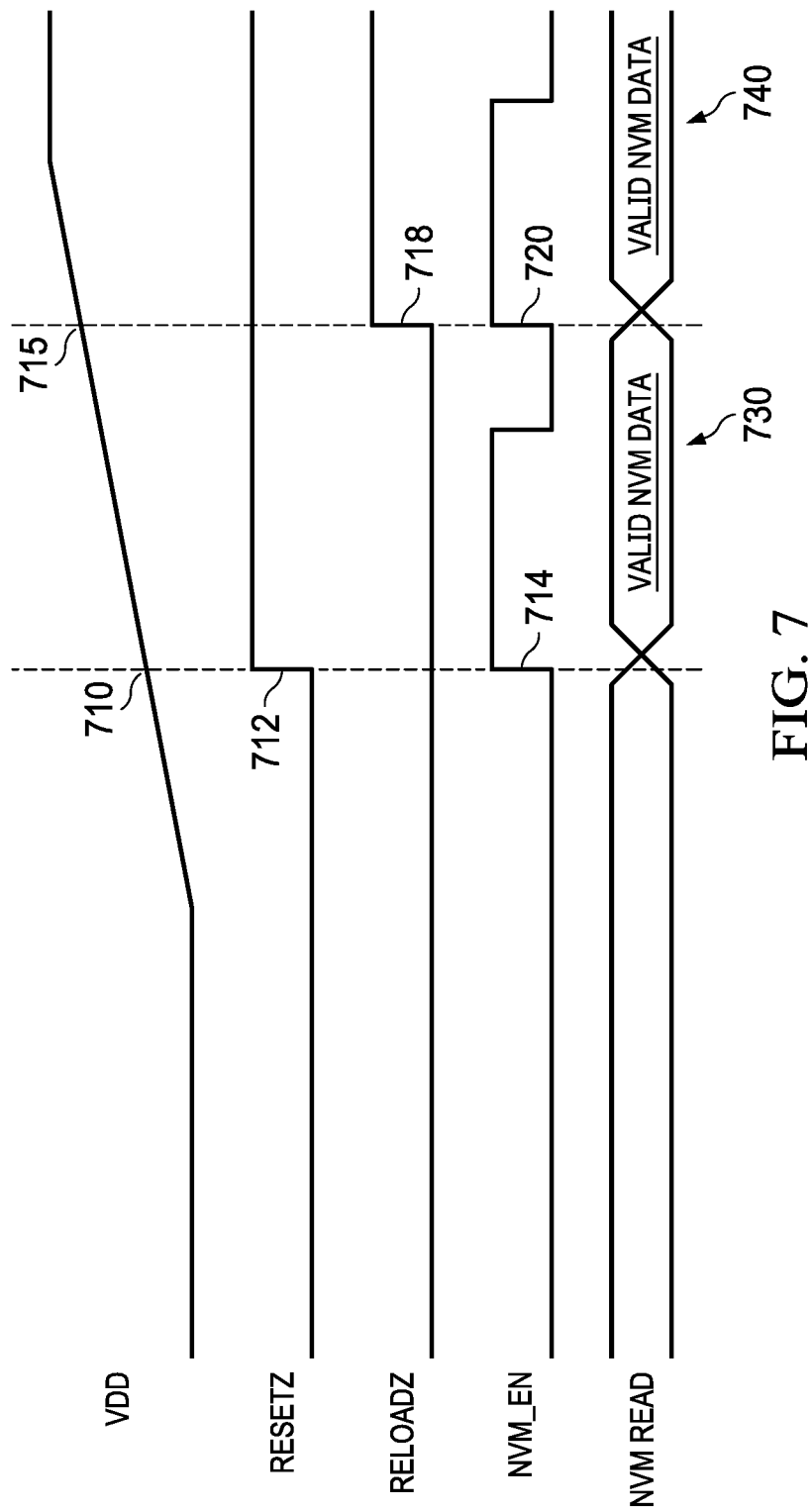
FIG. 7 includes a timing diagram illustrating the operation of the POR circuit and the digital logic circuit for the case depicted in FIG. 6.

FIG. 7 includes the timing diagram associated with FIG. 6 for the case in which a RELOADZ low to high transition is also present. VDD increases to the trip-point of comparator 210 at 710 thereby causing POR circuit 100 to transition RESETZ from low to high at 712. The rising edge of RESETZ at 712 causes the digital logic circuit 110 to assert NVM EN at 714 and initiate a read of NVM 120 at 730. Because VDD is above the minimum NVM read voltage during the read at 730, the return data from the NVM 120 to the digital logic circuit is considered valid.

As VDD continues to increase, it eventually reaches the trip-point for comparator 220 and RELOADZ is asserted high by comparator 220 at 718. Digital logic circuit 110 responds to RELOADZ being high by again asserting NVM EN high at 720 to initiate the second read of NVM 120 at 740. The second read at 740 is redundant because the first read at 730 returned valid data, but the second read is not harmful.

FIGS. 4-7 illustrate that a first read of NVM 120 is performed upon the digital logic circuit 110 being released from its reset state, and then a second read of NVM is performed when RELOADZ is asserted high. The first read may or may not return valid data from NVM 120 (it depends on whether VDD is below or above the minimum NVM read voltage during the first read), but in case the first read is invalid, a second, RELOADZ-based valid read is assured. Thus, the use of the comparators 210 and 220 with their trip-points being correlated due to the use of the same reference voltage circuit 202 ensures that valid read data is returned from NVM 120 using a POR circuit 100 that is of relatively low area and low complexity. The POR circuit 100 facilitates a relatively small difference (e.g., 200 mV or less) between minimum valid IC supply voltage and minimum valid voltage for the functional blocks (e.g. digital logic circuit 110 and NVM 120) within the IC.

Figure 8:
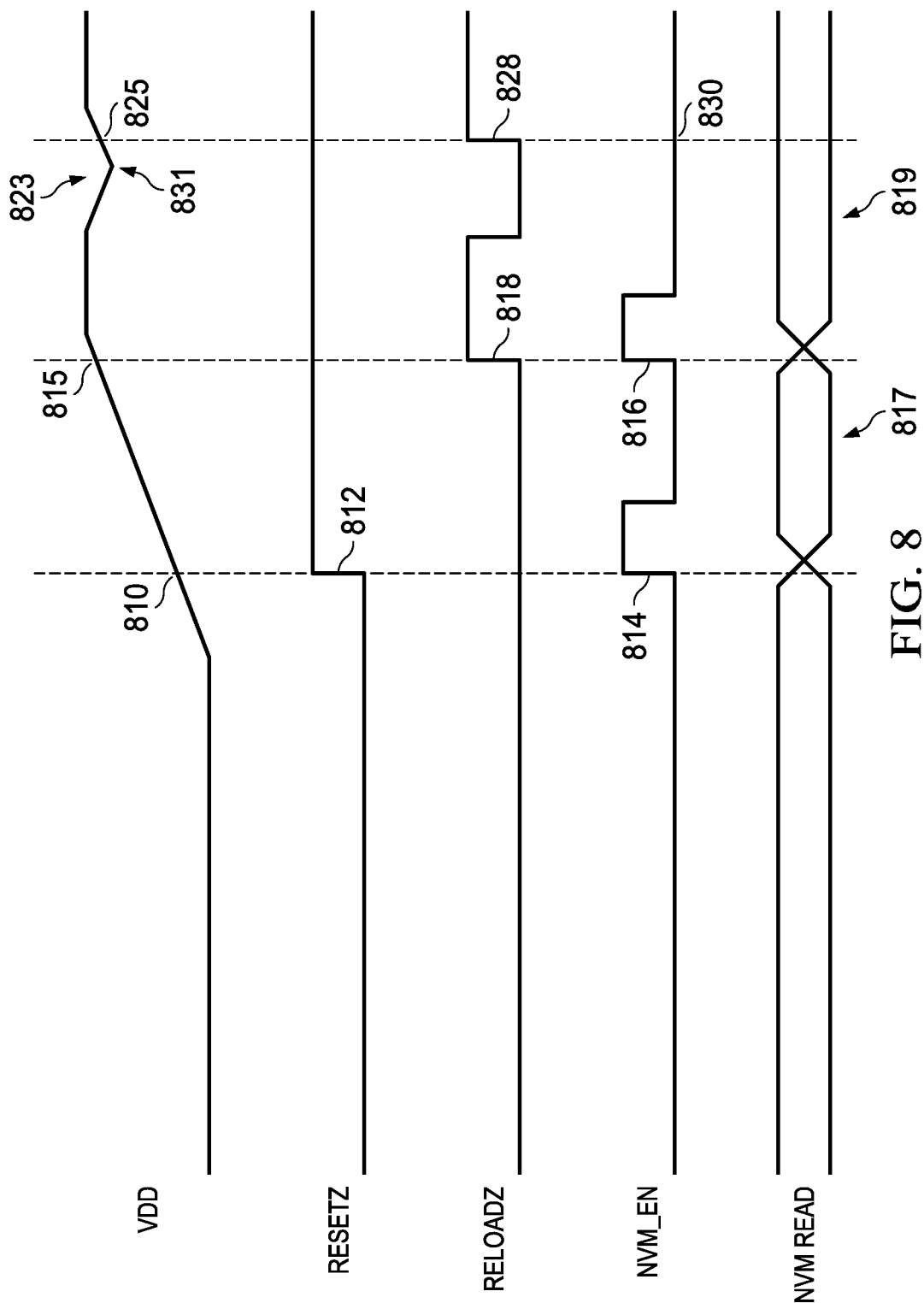
FIG. 8 includes a timing diagram illustrating the operation of the POR circuit and the digital logic circuit during a fluctuation of the supply voltage.

FIG. 8 illustrates the operation of POR circuit 100 and the digital logic circuit 110 during a fluctuation in the voltage level of VDD within the valid IC supply voltage range 315 after the initial power-on event. As described above, during a power-on event, VDD reaches the trip-point 810 corresponding to comparator 210, which causes RESETZ to be asserted high at 812. NVM EN is also asserted at 814 and a first read of NVM 120 is performed by the digital logic circuit 110 at 817. When VDD reaches the trip-point (815) corresponding to comparator 220 at 815, the POR circuit 100 asserts RELOADZ high (818) thereby triggering the digital logic circuit 110 to again assert NVM EN as shown at 816 and perform the second read at 819 of the NVM 120. At this point, the power-on event is complete.

Reference numeral illustrates 823 illustrates a subsequent fluctuation in VDD after the power-on event. VDD may dip below the trip-point of comparator 220 (as illustrated at 831). VDD may then increase and again reach the trip-point at 825 corresponding to comparator 220. Comparator 220 responds by again asserting RELOADZ high at 828. Digital logic circuit 110, however, precludes NVM EN from again being asserted high (as otherwise would have occurred at 830) and thus precludes another read of NVM 120 from being performed.

Figure 9:
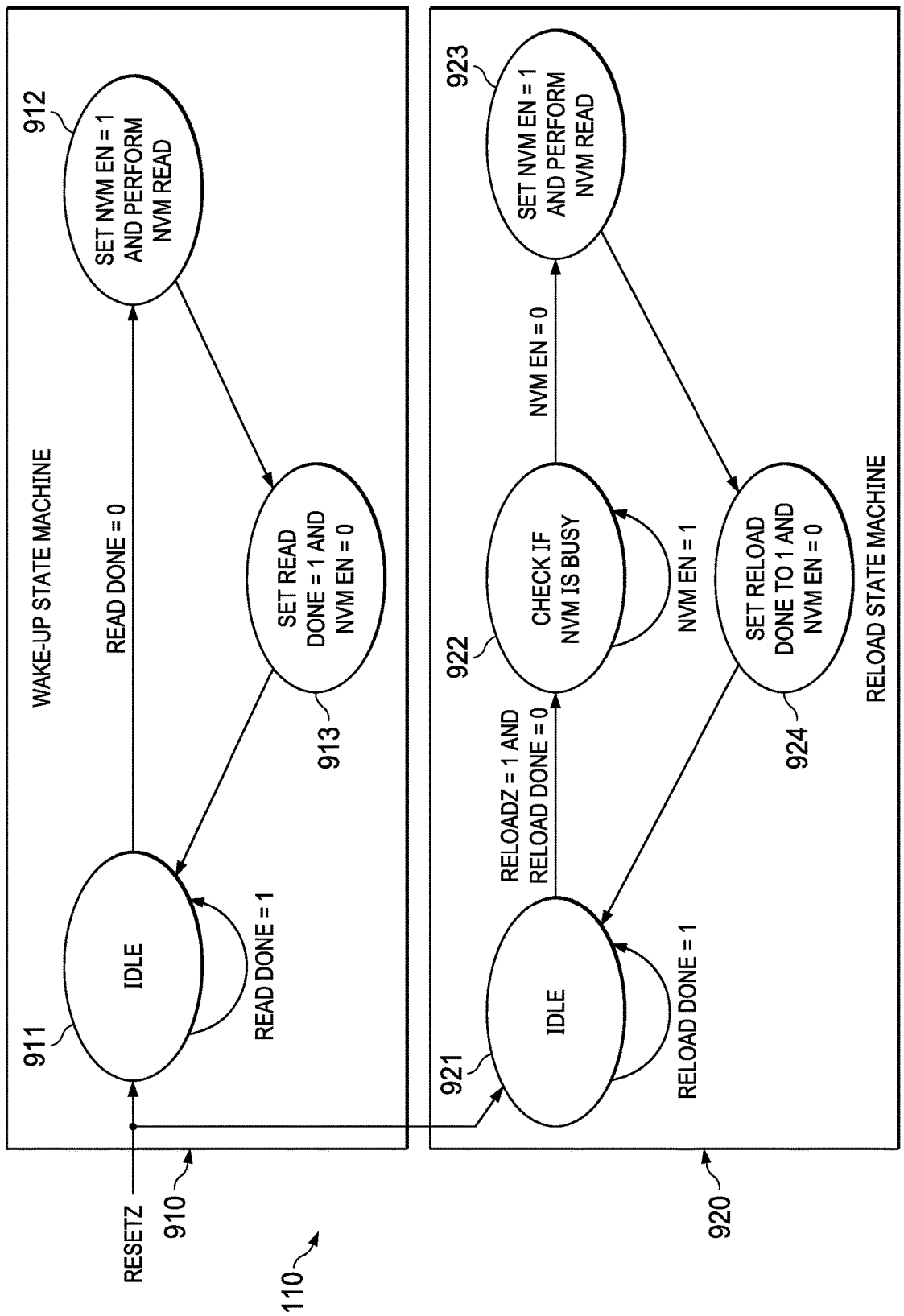
FIG. 9 shows an example implementation of the digital logic circuit of FIG. 1.

FIG. 9 shows an example implementation of digital logic circuit 110. The digital logic circuit 110 in this example is implemented as a combination of a wake-up state machine 910 and a reload state machine 920. Each state machine can be implemented as a combination of logic gates (AND gates, OR gates, inverters, etc.), flip-flops, and/or other circuit components. The detailed circuit implementation of state machines 910 and 920 can be synthesized using a suitable circuit synthetization tool based on the functionality of the digital logic circuit 110 described herein.

In the example of FIG. 9, wake-up state machine 910 has three operational states 911, 912, and 913. State 911 is the Idle state and the wake-up state machine 910 begins operation in the Idle state 911 upon RESETZ being asserted high. A flag, READ DONE, is stored in, for example, a flip-flop (not shown) and maintained by the wake-up state machine 910. The function of the READ DONE flag is to indicate when the NVM read operation post RESETZ low to high transition has happened. The reset (when RESETZ is low) value of the READ DONE flag is 0 indicating that the read operation post assertion of RESETZ has not yet been performed. When the RESETZ transitions from low to high, the state machine starts in IDLE state 911 with READ DONE flag set to 0. State machine 910 checks the value of READ DONE and given it is 0, the state machine transitions from state 911 to state 912. In state 912, the wake-up state machine 910 sets NVM EN to a value of 1 (high) and performs a read of NVM 120. Upon completion of the read of NVM 120, the state machine 910 transitions from state 912 to state 913 in which the state machine 910 sets NVM EN to 0 and sets the flag READ DONE to 1. A state transition then occurs back to the Idle state 911 and state-machine 910 remains in state 911 as long as READ DONE equals 1.

The reload state machine 920 has the four states 921-924 shown in the example of FIG. 9. State 921 is the Idle state and the reload state machine 920 begins operation in the Idle state 921 when RESETZ is asserted high. A flag RELOAD DONE is stored in a flip-flop (not shown) and maintained by the reload state machine 920. The function of RELOAD DONE is to indicate if an NVM read operation following the first low to high transition of RELOADZ has happened or not. The reset (when RESETZ is low) value of RELOAD DONE flag is 0 indicating that NVM read following the first RELOADZ low to high transition has not happened yet. When RESETZ transitions from low to high, the state machine 920 starts in state 921 with RELOAD DONE flag set to a value of 0. The state machine wafts in state 921 until RELOADZ becomes 1.

Upon a RELOADZ transition from low-to-high, reload state machine 920 transitions from state 921 to state 922 in which the state machine 920 checks whether an NVM operation is on-going (e.g., whether NVM is busy) by checking the value of NVM EN. If NVM EN is 1 when the reload state machine 920 is in state 922, the state machine will wait in state 922 until NVM EN becomes 0. Upon NVM EN becoming 0, state machine 920 transitions from state 922 to state 923. In state 923, the reload state machine 920 sets NVM EN to a value of 1 (high) and performs a read operation for NVM 120. Upon completion of the read of NVM 120, the state machine 920 transitions from state 923 to state 924, In state 924, the RELOAD DONE is set to 1 and NVM EN is set to 0. Subsequently the reload state machine 920 transitions into the idle state 921 and remains in the idle state 921 until the RELOAD DONE is set back to 0 by RESETZ going low (i.e. de-assertion of power supply).

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An integrated circuit (IC), comprising:
   a power-on reset (POR) circuit coupled to a supply voltage terminal and having first and second control outputs, the POR circuit is configured to generate a first control signal on the first control output responsive to a supply voltage on the supply voltage terminal exceeding a first threshold voltage and is configured to generate a second control signal on the second control output responsive to the supply voltage exceeding a second threshold voltage; and
   a digital logic circuit having a first control input coupled to the first control output of the POR circuit and having a second control input coupled to the second control output of the POR circuit, the digital logic circuit is configured to initiate a first transaction responsive to assertion of the first control signal and to initiate a second transaction responsive to assertion of the second control signal;
   wherein the first transaction is a read of a memory and the second is a read of the memory.

2. An integrated circuit (IC), comprising:
   a power-on reset (POR) circuit coupled to a supply voltage terminal and having first and second control outputs, the POR circuit is configured to generate a first control signal on the first control output responsive to a supply voltage on the supply voltage terminal exceeding a first threshold voltage and is configured to generate a second control signal on the second control output responsive to the supply voltage exceeding a second threshold voltage; and
   a digital logic circuit having a first control input coupled to the first control output of the POR circuit and having a second control input coupled to the second control output of the POR circuit, the digital logic circuit is configured to initiate a first transaction responsive to assertion of the first control signal and to initiate a second transaction responsive to assertion of the second control signal;
   further including a memory coupled to the digital logic circuit, the memory storing a trim value for the IC.

3. A circuit, comprising:
   a voltage divider coupled between a supply voltage terminal and a common terminal and having a first voltage divider terminal and a second voltage divider terminal;
   a reference voltage generator;
   a first comparator coupled to the first voltage divider terminal and to the reference voltage generator, the first comparator having a comparator output to produce a first control signal; and a second comparator coupled to the second voltage divider terminal and to the reference voltage generator, the second comparator having a comparator output to produce a second control signal;

further including a digital logic circuit having a first control input and a second control input, the first control input is coupled to the comparator output of the first comparator and the second control input is coupled to the comparator output of the second comparator;

wherein the digital logic circuit is configured to initiate a first read transaction responsive to assertion of the first control signal from the first comparator and to initiate a second read transaction responsive to assertion of the second control signal from the second comparator.

4. The circuit of claim 3, wherein the first and second read transactions are read transactions to a common memory.

5. An integrated circuit (IC), comprising:
a power-on reset (POR) circuit coupled to a supply voltage terminal, the POR circuit includes first and second comparators, the first comparator has a first comparator output, the first comparator is configured to generate a first control signal on the first comparator output responsive to a supply voltage on the supply voltage terminal exceeding a first threshold voltage, and the second comparator has a second comparator output, the second comparator is configured to generate a second control signal on the second comparator output responsive to the supply voltage exceeding a second threshold voltage, the POR circuit also includes a reference voltage generator coupled to the first comparator and to the second comparator;
a memory; and
a digital logic circuit coupled to the memory, the digital logic circuit having a first control input coupled to a first control output of the POR circuit and having a second control input coupled to a second control output of the POR circuit, the digital logic circuit is configured to initiate a first read transaction to the memory responsive to assertion of the first control signal and to initiate a second read transaction to the memory responsive to assertion of the second control signal.

6. The IC of claim 5, wherein:
the POR circuit includes a voltage divider coupled to the supply voltage terminal and a common terminal and having a first voltage divider terminal and a second voltage divider terminal,
the first comparator has an input coupled to the first voltage divider terminal; and
the second comparator has an input coupled to the second voltage divider terminal.

7. The IC of claim 5, wherein the memory stores a trim value, and the digital logic circuit is configured to read the trim value from the memory.

8. The IC of claim 5, wherein the digital logic circuit is configured to avoid initiating, following a power-on event, a subsequent read transaction to the memory responsive to a subsequent assertion of the second control signal following a power-on event.

* * * * *